FREQUENCY STABILIZATION

Filed May 9, 1951

INVENTORS
ROLAND M. GOGOLICK
AND JAMES G. TABLER
BY
Oberlin & Limbach
ATTORNEYS.

United States Patent Office 2,744,197
Patented May 1, 1956

2,744,197

FREQUENCY STABILIZATION

Roland Marshall Gogolick and James Gilmore Tabler, East Cleveland, Ohio, assignors to Globe-Union Inc., Milwaukee, Wis., a corporation of Delaware Application May 9, 1951, Serial No. 225,392

9 Claims. (Cl. 250—36)

Devices for frequency stabilization of radio and telephone transmission lines have been limited mainly to piezoelectric and magnetostrictive devices. In the general field of communications, the need for precise control of broadcast and reception frequencies has increased markedly with the multiplication of transmitting stations in existence. Also in small scale transmitters used for field work such as the familiar walkie-talkie, the requirements for control of frequency from the point of view of numbers develops at a tremendous rate. The major function of frequency control is the prevention of interference of communications from one broadcast system to another. Not only must a precise frequency be used, but the band of frequencies traversed at this peak value must be as narrow as possible.

Magnetostrictive devices consisting primarily of accurately dimensioned nickel rods are limited to the low frequency range. For the most part, the standard frequency stabilization devices are single crystals of piezoelectric quartz cut and polished along certain precise and preferred crystallographic directions. In a piezoelectric crystal, the application of an alternating current results in a synchronized mechanical movement, or conversely the application of an oscillative or pulsed mechanical pressure results in the development of a synchronized voltage. The strong electromechanical coupling of piezoelectric crystals is favorable for the purposes of frequency stabilization.

As indicated, quartz crystals are standard devices for frequency stabilization. It is not generally realized, however, that the coupling mechanism of quartz has a subordinate meaning and the high Q and small temperature coefficient of the resonating frequency of the particular cut are the deciding factors. The combination of need of a single crystal and the precision forming along certain crystallographic directions makes quartz a relatively expensive medium. All single crystal devices such as quartz now used for frequency stabilization are insulators.

In accordance with the present invention however, frequency stabilization means may be had which avoids the limitations of quartz crystals and magnetostrictive devices, and control devices may be had which are applicable in a wide range of usages, and making possible also substantial economies in production. Other objects and advantages will appear from the following description.

To the accomplishment of the foregoing and related ends, said invention then comprises the features hereinafter fully described and particularly pointed out in the claims, the following description and the annexed drawing setting forth in detail certain illustrative embodiments of the invention, these being indicative, however, of but a few of the various ways in which the principle of the invention may be employed.

Figure 1:
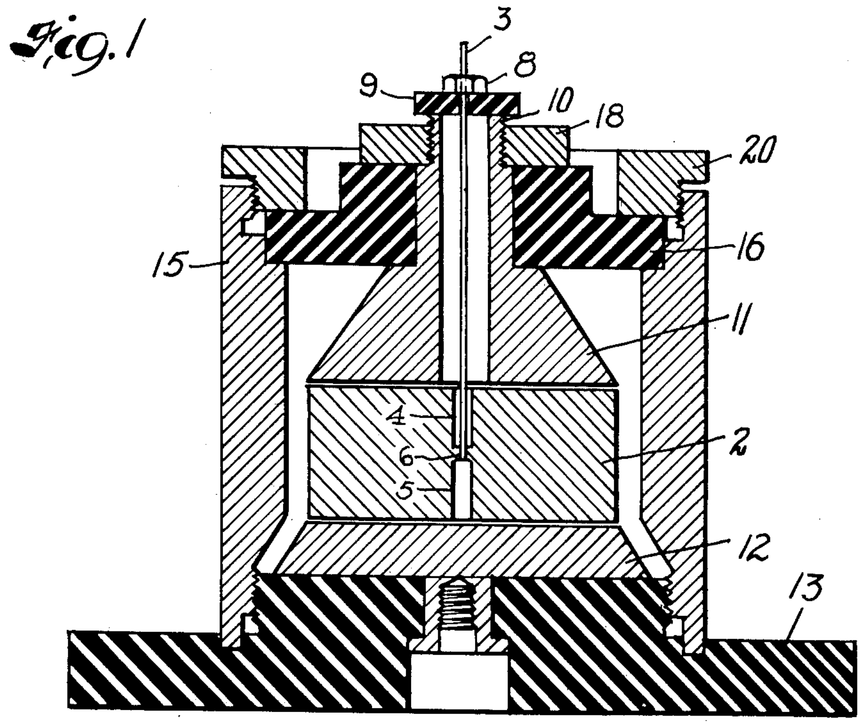
Figure 2:
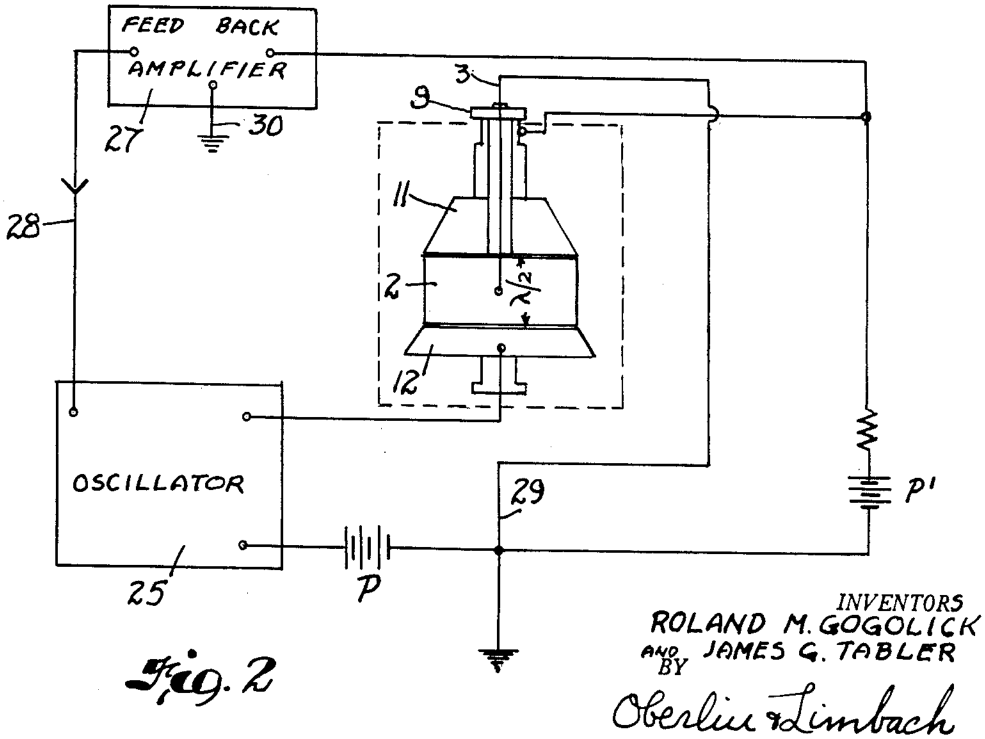

In said annexed drawing:

Fig. 1 is a sectional view through a frequency stabilization device in accordance with the invention; and Fig. 2 is a wiring diagram showing the complete setup with voltage supply.

We have found a group of materials and devices which are highly effective as frequency stabilization means for operation up into the radio frequency range. Further, these novel devices are effective when used in the form of polycrystalline masses and may be classed as conductors of electricity. In addition, we have found that these devices may be operated through electrostatic coupling, so that in this manner the mechanical and electrical portions of the properties useful in frequency stabilization can be treated separately. By virtue of our use of polycrystalline masses and through the fact that these masses are substantially metallic in character, a substantial economy is available. Basically these devices eliminate the requirement that the oscillating body be a single crystal, or an insulator, or have piezoelectric or magnetostrictive properties.

With our novel devices then, is an added advantage of being able to apply the type of coupling used in electrostatic microphones, so that actual physical contact between the oscillating body and electrical circuit is not required. This coupling mechanism is applicable to a conductor or semiconductor without the introduction of the appreciable damping of oscillation which is normally encountered through the necessity for gluing on electrodes, the standard practice in the case of quartz crystals. The use of glued-on electrodes thus is a factor in reducing the effective Q of a quartz crystal.

If electrostatic coupling is used as a means for taking advantage of the frequency stabilization characteristics of these materials, the requirements may be stated to be somewhat as follows: The materials shall have as high a Q as possible and the resonant characteristics of the system should not change substantially with temperature, pressure, age, and the like. Theoretically, the lower the internal damping the higher the Q of resonance. Phrased in words involving a mechanical analogy, it may be stated that a material having zero internal damping is substantially perfectly elastic, that is, stress and strain relationships are completely reversible with no hysteresis and no loss leading to a reduction in Q. Thus if a metal system is involved as a resonating mechanism, hysteresis, plasticity, ductility, or any factor which may affect the internal damping on aging cannot be present if it would be used for purposes of stabilization of frequency. For example, a single crystal of copper may be placed in resonance and for a few minutes it acts as an efficient stabilizer. However, as the material continues to be used, the hysteresis losses increase sharply and it is found that in view of the plasticity of the base material, slip bands and dislocations begin to develop, and the internal damping rises rapidly. In general, it would be expected that such defect as the foregoing would be found in substantially any metal system.

However, we have found that certain unusual metal systems do not exhibit these defects and if properly shaped are permanently suitable. We have found that in order for metallic types of materials to be suitable, they must be hard, completely brittle, and are examples of the alloy system described by the term "electron compound," a recently discovered group of materials in the metal field. An electron compound is concisely defined as a composition in which the structures of the various phases and the forms on equilibrium diagrams are determined primarily by the electron concentration of the constituents. (e. g., the book "Atomic Theory for Students of Metallurgy" by Wm. Hume-Rothery, pub. 1948, by the Institute of Metals, London). Such electron compounds are an intermediate phase in an alloy system of which the crystalline structure and composition are both controlled mainly by the establishment of a certain electron-atom ratio. These electron compound alloys have been primarily described in the literature as intermetallic compounds of composition types by the three different solid forms between copper and zinc, CuZn, $Cu_5Zn_8$ and $CuZn_3$, conveniently designated beta, gamma and epsilon repectively. Such compounds are not restricted to copper and zinc composition, but the peculiar characteristic is that there is a definite ratio of valence electrons to number of atoms in each type. This is illustrated in the following:

| | Number of Electrons | Number of Atoms | Ratio |
|---|---|---|---|
| Beta Alloys: | | | |
| CuZn | 3 | 2 | 3:2 |
| AgCd | 3 | 2 | 3:2 |
| AuZn | 3 | 2 | 3:2 |
| $Cu_5Sn$ | 9 | 6 | 3:2 |
| Gamma Alloys: | | | |
| $Cu_5Zn_8$ | 21 | 13 | 21:13 |
| $Cu_{31}Sn_8$ | 63 | 39 | 21:13 |
| $Ni_5Zn_{21}$ | 42 | 26 | 21:13 |
| Epsilon Alloys: | | | |
| $CuZn_3$ | 7 | 4 | 7:4 |
| $Cu_3Sn$ | 7 | 4 | 7:4 |
| $AgCd_3$ | 7 | 4 | 7:4 |
| $Au_3Sn$ | 7 | 4 | 7:4 |

These beta, gamma and epsilon structures are employed for the purposes of the present invention, and all of the group, i. e., electron compound alloys of the electron atom ratio series 3/2, 21/13 and 7/4 are involved. The beta structure, as noted, has an electron atom ratio of 3/2, the gamma structure an electron atom ratio of 21/13, and the epsilon structure an electron atom ratio of 7/4. The crystal structure of the beta type is body centered cubic, and the crystal structure of the epsilon type is close packed hexagonal, while the gamma structure is intermediate. The methods for making these in pure form are now well known, and need not be referred to here.

Available and practicable beta, gamma and epsilon alloys are as follows:

*Beta brass structure alloys*

| | |
|---|---|
| AgAl | $Cu_3Ga$ |
| AgCd | CuIn |
| AgZn | CuPd |
| AgCo | $Cu_5Sn$ |
| $AlCu_3$ | CuZn |
| AlFe | FePt |
| AlLi | HgMg |
| AlNd | $Mn_3Si$ |
| AlNi | NiZn |
| AuCd | LaMg |
| AuMg | $LaMg_3$ |
| AuZn | CeMg |
| BeCo | $CeMg_3$ |
| BeCu | PrMg |
| BeNi | $PrMg_3$ |
| BePd | CuSb |

*Gamma brass structure alloys*

| | |
|---|---|
| $Ag_5Hg_8$ | $Cd_{21}Rh_5$ |
| $AgLi_3$ | $Co_5Zn_{21}$ |
| $Ag_5Zn_8$ | $Cu_9Ga_4$ |
| $Al_4Cu_9$ | $Cu_9In_4$ |
| $Au_5Zn_8$ | $Cu_{31}Si_8$ |
| $Be_{21}Ni_5$ | $Cu_{31}Sn_8$ |
| $Be_{21}Pt_5$ | $Cu_5Zn_8$ |
| $Be_{21}Co_5$ | $Fe_5Zn_{21}$ |
| $Cd_8Cu_5$ | $Ni_5Zn_{21}$ |
| $Cd_{21}Ni_5$ | $Pd_5Zn_{21}$ |
| $Cd_{21}Pd_5$ | $Pt_5Zn_{21}$ |
| $Cd_{21}Pt_5$ | $Rh_5Zn_{21}$ |

*Epsilon brass structure alloys*

| | |
|---|---|
| $Ag_5Al_3$ | $AuZn_3$ |
| $AgCd_3$ | $Cu_3Ge$ |
| AgSb | Cu–Sb |
| $Ag_3Sn$ | $Cu_3Si$ |
| $AgZn_3$ | $Cu_3Sn$ |
| $AuCd_3$ | $CuZn_3$ |
| $Au_3Sn$ | FeZn |

Of these, the following are of particular desirability:

1. Beta, gamma, and epsilon brasses and bronzes.
2. Beta brass (copper zinc) with 10, 20, and 30% of the beta alloy, silver zinc.
3. Beta brass (copper zinc) with 10, 20, and 30% of the beta alloy, copper antimony.
4. The aluminides of iron, nickel, and cobalt having the beta structure.
5. The gamma alloys of nickel zinc.

Such alloys made up into frequency stabilization devices are resonating bodies possessing no electromechanical properties such as piezoelectricity and magnetostriction. These electron compound resonating bodies are conductors of electricity.

In general, we have developed a means of stabilization of frequency attendant on oscillating circuits by use of electrostatic coupling of the circuit with a resonating bar or properly shaped sample of an electron compound type of alloy. These electron compound types of alloys are effective in that they exhibit substantially zero internal damping, are approximately perfectly elastic, and are not cold-worked by continuous vibration such as encountered in frequency stabilization circuits. Most important, from the point of view of economy, these electron compounds may be used in the form of properly shaped polycrystalline masses.

The resonator may vary in size and shape from a long thin bar to a flat disk. Its usual mode of oscillation at resonance is longitudinal with the length of the resonator being approximately ½ of a wavelength. The capacity variation in the collector plates is caused by the dimensional change of the resonator at its resonant frequency, thus changing the air gap proportionately. In the case of use of a long bar, for example 12 in. x ½ in. diam., a null point is produced at the center and one means of utilizing the resonant frequency of the oscillating bar is suspension of the resonator at its center. The preferred form involves a disk in which a properly shaped hole is drilled leaving a constriction in the center of the hole. The resonator is then suspended on a rod and gripped by the seizure at the constriction.

Thus, as illustrated in Fig. 1, the resonator 2 of an electron compound alloy as afore-mentioned, is accurately shaped and dimensioned, such as by machining, and in the form illustrated, as a disk is suspended by a steel rod 3 which attaches to the resonator at its mass center by press fit seizure. For this, the disk may be drilled as bores 4, 5 in axial alignment but separated centrally at 6 where a restricted bore of smaller size is provided such as to seize and hold the rod 3 when forced therein. The rod with its resonator then is suspended, as for instance by an engaging nut 8 which rests on an insulating block 9 which in turn rests on the threaded neck 10 of an electrode 11. Another electrode 12 is opposite and is supported by an insulating base 13. The resonator or frequency stabilizer 2 is in spaced relation for electrostatic coupling between the electrodes 11 and 12. The electrodes are of metal, for example brass, and the assembly is surrounded by a shielding housing 15 of metal, for example brass, and this is supported on the insulating block 13 and in turn supports an insulating block 16 which encloses the neck of the electrode 11 and is supported on an internal ledge of the shell 15, while a nut 18 screw threaded on the neck of the electrode carries the electrode and the resonator. An annular closure member 20 is screw threaded into the end of the shell or housing 15 against the insulating block 16. The rod 3 supporting the resonator or stabilizer 2 is grounded in use, and the electrode 11 is fed in the circuit with a source of frequency or an oscillator, and electrode 12 is connected to an amplifier which feeds a synchronizing voltage back to the oscillator.

The dimensions of the resonator or stabilizer depend upon the frequency desired and the particular alloy which makes up the body. In general, the smaller the device, the higher the frequency, and for instance a dimensioning on the order of 0.086 in. and diameter 1.5 in. with a suitable alloy will resonate at one megacycle, while a resonator with dimensioning on the order a thickness 1.00 in. and diameter 2.375 in. with appropriate alloy will resonate at 85 kilocycles. Dimensioning and adaptation between such illustrative figures and also outside thereof will be employed as required in any given situation.

The generalized circuitry for frequency control is shown in Fig. 2, the resonator 2 in electrostatic coupling between the electrodes 12, 11, the electrode 12 being connected to the frequency source or oscillator 25, while the electrode 11 is connected at 26 to output its A. C. voltage to an implifier 27, which in turn provides synchronizing feed back voltage through connection 28 to the oscillator 25. The rod supporting the resonator body is grounded through a connection 29. The amplifier is also grounded through a connection 30. The oscillator 25 is operated at approximately the resonant frequency of the resonator 2, and as seen it is coupled to the driving electrode 12, and the output of the resonator, amplified by amplifier 27 synchronizes the oscillator 25 at the resonant frequency of the resonator 2, thus accomplishing stabilization. In effect, this is a closed system tuning-fork type of electronic circuit.

Accordingly, in our frequency stabilization device the system is composed generally of a main resonating body, or a group of resonators, and a set of capacitor plates in close proximity to the resonator coupled through the medium of an air dielectric. The plates form capacitors with the resonators and with proper A. C. voltages applied to the system, an electrostatic force will be exerted on the resonator. If the applied voltages are of the proper frequency, resonant conditions are set up in the electron compound alloy disk. With such resonant frequencies, the amplitude of vibration of the resonator will be very much larger than the non-resonant frequencies and through such means the mechanical resonance may be used to control the frequency of oscillation in electrical circuits.

The general systems described have many applications for frequency control. They may be used as the frequency determining element in a feed back network of a feed back oscillator. They may be also driven by a free running oscillator and the output used to control the oscillator frequency. These systems are also effective in proper circuitry to provide suitable band pass filters for telephony and other circuit applications requiring sharp attenuation versus frequency characteristics. In preparation of the resonator for the described purpose, the size determines the frequency at which the bar may be set in oscillation and the piece is then accurately machined to this size and shape.

The resonant frequency is determined by varying a superimposed alternating voltage on a D. C. polarizing voltage between 100 and 200 volts which is applied between one of the driving plates and the disk. A second polarizing voltage of like magnitude is applied between the other plate and the disk and the alternating voltage appearing superimposed on the second polarizing voltage is detected. The first mentioned alternating current voltage may be termed the driving voltage and the second, the output voltage of the resonator. The frequency of the driving voltage is varied. As it passes through the fundamental mechanical resonant frequency of the disk, a large change in the output voltage will be observed.

The Q or quality of the resonance may be measured by a number of methods of which the logarithmic decay procedure is the simplest. In this case, the disk is driven at its resonant frequency and its output voltage measured on a cathode ray oscilloscope with a triggered single sweep. The driving voltage is then deflected by a switch which simultanously triggers the sweep. A photographic recording of the output voltage on the triggered single sweep is made. The Q may be calculated from the logarithmic decay of the output voltage which is measured on the photograph.

Under these conditions, the Q of the polycrystalline beta brass disk measured by this method is approximately 20,000.

The following examples are illustrative of our invention:

*Example 1*.—A beta brass structure consisting of the polycrystalline alloy Cu-Zn, an electron compound, is machined to disk form having a thickness of 1.00″ and a diameter of 2.375″. This piece may be thrown into mechanical resonance and is a stabilizer of frequency at 85 kilocycles.

*Example 2*.—A gamma brass structure consisting of the polycrystalline electron compound $Cu_5Zn_8$ is machined to disk form having a thickness of 1.00″ and a diameter of 2.375″. The device resonates at a frequency of 85 kilocycles and is a mechanical stabilizer for control purposes.

*Example 3*.—An epsilon brass structure consisting of a polycrystalline electron compound alloy of formula $CuZn_3$ is machined in the form of a disk having a thickness of 1.00″ and diameter of 2.375″. This disk of epsilon brass resonates at 85 kilocycles and in the circuits as given is an effective controller or stabilizer of frequency.

*Example 4*.—A beta brass structure consisting of polycrystalline electron compound type alloy $Cu_5Sn$ is machined to a disk having a thickness of 0.688″ and diameter 2.00″. It resonates at 125 kilocycles and operates for control of frequency.

*Example 5*.—A beta brass structure consisting of the polycrystalline electron compound type of alloy composed approximately of 70 parts of copper zinc and 30 parts of copper antimony is cut and machined in the form of a disk having a thickness of 0.688″ and a diameter of 2.00″. The resonate frequency is 125 kilocycles and the piece acts as an effective stabilizer and controller of this frequency.

*Example 6*.—The beta structure alloy of polycrystalline FeAl, an electron compound, is cut and machined in the form of a disk having a thickness of 0.344″ and a diameter of 1.75″. It acts as a controller of frequency resonating mechanically at 250 kilocycles.

*Example 7*.—The epsilon alloy structure of polycrystalline $Cu_3Sn$, an electron compound alloy, is cut and machined in the form of a disk having a thickness of 0.172″ and a diameter of 1.5″. It will resonate at 500 kilocycles and acts as a stabilizer of frequency mechanically in the circuit depicted.

*Example 8*.—The beta alloy of polycrystalline structure consisting of 70 parts of Cu-Zn and 30 parts of Ag-Zn, an electron compound, is cut and machined in the form of a disk having a thickness of 0.086″ and a diameter of 1.5″. It is an effective stabilizer of frequency by virtue of its mechanical resonance at 1 megacycle.

Other modes of applying the principle of the invention may be employed, change being made as regards the details described, provided the features stated in any of the following claims or the equivalent of such be employed.

We therefore particularly point out and distinctly claim as our invention:

1. In combination with an oscillator generator having input and output circuits, a frequency stabilization device comprising a body made of an electron compound metal alloy characterized by low internal damping of mechanical vibrations, means supporting said body for vibration including a member engaged with the body at substantially the mass center thereof, a pair of electrodes arranged in closely spaced relation with said body to form first and second capacitors therewith, means for applying constant potential across the thus formed capacitors, means connecting the first capacitor in the output circuit of said oscillation generator electrostatically to drive said body to resonance, and means connecting the second capacitor in the input circuit of the generator, thereby to feed back to the generator a synchronizing voltage at the frequency of mechanical resonance of said body.

2. In combination with an oscillation generator having input and output circuits, a frequency stabilization device comprising a body made of an electron compound metal alloy characterized by low internal damping of mechanical vibrations, means supporting said body for vibration, a pair of electrodes arranged in closely spaced relation with said body to form first and second capacitors therewith, means for applying constant potential across the thus formed capacitors, means connecting the first capacitor in the output circuit of said oscillation generator electrostatically to drive said body to resonance, and means connecting the second capacitor in the input circuit of the generator, thereby to feed back to the generator a synchronizing voltage at the frequency of mechanical resonance of said body.

3. In combination with an oscillation generator having input and output circuits, a frequency stabilization device comprising a body made of an electron compound metal alloy characterized by low internal damping of mechanical vibrations, means supporting said body for vibration including a member engaged with the body at substantially the mass center thereof, a pair of electrodes arranged in closely spaced relation with said body to form first and second capacitors therewith, means for polarizing said electrodes, means connecting the first capacitor in the output circuit of said oscillation generator electrostatically to drive said body to resonance, and means connecting the second capacitor in the input circuit of the generator, thereby to feed back to the generator a synchronizing voltage at the frequency of mechanical resonance of said body.

4. In combination with an oscillation generator having input and output circuits, a frequency stabilization device comprising a body made of an electron compound metal alloy characterized by low internal damping of mechanical vibrations, means supporting said body for vibration, means for polarizing said electrodes, means connecting the first capacitor in the output circuit of said oscillation generator electrostatically to drive said body to resonance, and means connecting the second capacitor in the input circuit of the generator, thereby to feed back to the generator a synchronizing voltage at the frequency of mechanical resonance of said body.

5. In combination with a source of electrical oscillations, an electromechanical resonator comprising a pair of electrodes, a vibratory body made of an electron compound metal alloy, means mounting said body for vibration between said electrodes in closely spaced relation respectively therewith, and means for applying output oscillations of such source across said body and one of the electrodes electrostatically to drive the body.

6. A frequency stabilization device comprising a vibratory body made of a beta brass alloy, means supporting said body for vibration including a member engaged with the body at substantially the mass center thereof, and a pair of electrodes arranged in closely spaced relation with said body to form two capacities therewith, the body being adapted to be driven electrostatically by an oscillating signal applied across one such capacity.

7. A frequency stabilization device comprising a vibratory body made of a beta brass alloy, means supporting said body for vibration, and a pair of electrodes arranged in closely spaced relation with said body to form two capacities therewith, the body being adapted to be driven electrostatically by an oscillating signal applied across one such capacity.

8. A frequency stabilization device comprising a vibratory body made of an electron compound metal alloy, means supporting said body for vibration including a member engaged with the body at substantially the mass center thereof, and a pair of electrodes arranged in closely spaced relation with said body to form two capacities therewith, the body being adapted to be driven electrostatically by an oscillating signal applied across one such capacity.

9. A frequency stabilization device comprising a vibratory body made of an electron compound metal alloy, means supporting said body for vibration, and a pair of electrodes arranged in closely spaced relation with said body to form two capacities therewith, the body being adapted to be driven electrostatically by an oscillating signal applied across one such capacity.

References Cited in the file of this patent

UNITED STATES PATENTS

| | | |
|---|---|---|
| Re. 17,357 | Cady | July 2, 1929 |
| 1,941,445 | Deisch | Dec. 26, 1933 |
| 2,002,191 | Runge | May 31, 1935 |
| 2,092,762 | Kroger | Sept. 14, 1937 |
| 2,141,466 | Groene | Dec. 27, 1938 |
| 2,173,902 | Gerth et al. | Sept. 26, 1939 |
| 2,201,076 | Brogden | May 14, 1940 |
| 2,271,200 | Mason | Jan. 27, 1942 |
| 2,299,260 | Sivian | Oct. 20, 1942 |
| 2,317,523 | Delano | Apr. 27, 1943 |
| 2,437,609 | Mayle | Mar. 9, 1948 |
| 2,514,080 | Mason | July 4, 1950 |
| 2,591,223 | Wild | Apr. 1, 1952 |